United States Patent
Yang

(10) Patent No.: US 10,651,227 B2
(45) Date of Patent: May 12, 2020

(54) ARRAY SUBSTRATE FOR X-RAY DETECTOR AND X-RAY DETECTOR INCLUDING THE SAME

(71) Applicant: LG Display Co., Ltd., Seoul (KR)

(72) Inventor: Jungyul Yang, Uijeongbu-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/219,315

(22) Filed: Dec. 13, 2018

(65) Prior Publication Data

US 2019/0198557 A1 Jun. 27, 2019

(30) Foreign Application Priority Data

Dec. 27, 2017 (KR) .................. 10-2017-0181604

(51) Int. Cl.
| | | |
|---|---|---|
| H01L 27/146 | (2006.01) | |
| G01T 1/24 | (2006.01) | |
| G01T 1/20 | (2006.01) | |
| H01L 31/117 | (2006.01) | |
| H01L 31/075 | (2012.01) | |
| H01L 31/08 | (2006.01) | |
| H01L 31/105 | (2006.01) | |
| H01L 29/868 | (2006.01) | |

(52) U.S. Cl.
CPC ...... *H01L 27/14663* (2013.01); *G01T 1/2018* (2013.01); *G01T 1/241* (2013.01); *H01L 27/14603* (2013.01); *H01L 27/14623* (2013.01); *H01L 27/14636* (2013.01); *H01L 27/14658* (2013.01); *H01L 29/868* (2013.01); *H01L 31/075* (2013.01); *H01L 31/105* (2013.01); *H01L 31/117* (2013.01); *H01L 31/1175* (2013.01); *H01L 31/085* (2013.01); *H01L 2924/12031* (2013.01)

(58) Field of Classification Search
CPC ........ H01L 27/14663; H01L 27/14658; H01L 31/085; H01L 31/075; H01L 31/105; H01L 31/117; H01L 31/1175; H01L 27/14603; H01L 27/14609; H01L 27/14636; H01L 29/868; H01L 2924/12031; G01T 1/2018; G01T 1/241
See application file for complete search history.

(56) References Cited

U.S. PATENT DOCUMENTS

2016/0013242 A1* 1/2016 Yang ............... H01L 27/14658
257/292

* cited by examiner

*Primary Examiner* — Thanhha S Pham
(74) *Attorney, Agent, or Firm* — Seed IP Law Group LLP

(57) ABSTRACT

An array substrate for an X-ray detector and an X-ray detector including the reduces or minimizes a leakage current caused by etching of a PIN layer, and also reduces or minimizes light reaction of the PIN layer within a non-pixel region. The array substrate for the X-ray detector includes an integrated PIN layer formed to cover all pixel regions. Upper electrodes, which are spaced apart from each other according to individual pixel regions, are disposed over the PIN layer. A light shielding portion is disposed between neighboring upper electrodes.

20 Claims, 6 Drawing Sheets

ARRAY SUBSTRATE FOR X-RAY DETECTOR AND X-RAY DETECTOR INCLUDING THE SAME

CROSS-REFERENCE TO RELATED APPLICATION

This application claims the priority of Korean Patent Application No. 10-2017-0181604 filed on Dec. 27, 2107, in the Korean Intellectual Property Office, the disclosure of which is hereby incorporated by reference in its entirety.

BACKGROUND

Technical Field

The present disclosure relates to an array substrate for an X-ray detector to reduce or minimize a leakage current, and an X-ray detector including the same.

Description of the Related Art

With the rapid development of digital technology, an X-ray detector based on a thin film transistor (TFT) has recently been developed and rapidly come into medical use. The X-ray detector refers to an apparatus capable of detecting the transmission amount (e.g., transmissivity) of X-rays passing through a subject and displaying internal images of the subject on a display.

Generally, the digital X-ray detector is designed to have several thousand or tens of thousands of pixels or many more pixels according to the size or resolution thereof. An array substrate for a digital X-ray detector corresponding to the respective pixels includes a plurality of thin film transistors and a plurality of PIN diodes, and a scintillator layer is formed over the array substrate.

When X-rays are emitted to the digital X-ray detector, the scintillator layer converts the incident X-rays into visible light, such that the visible light is transmitted to the PIN diode. The PIN diode includes a lower electrode, a PIN layer, and an upper electrode.

The visible light applied to the PIN diode is re-converted into an electronic signal in the PIN layer. The electronic signal is converted into an image signal after passing through the thin film transistor connected to the lower electrode of the PIN diode, such that the resultant image signal is displayed on a display.

Meanwhile, a bias electrode for applying a voltage to the PIN diode to drive the PIN diode is connected to the PIN diode. The bias electrode is disposed over the PIN diode, and is connected to the upper electrode of the PIN diode.

As described above, the array substrate for the conventional digital X-ray detector includes a plurality of PIN diodes, and the respective PIN diodes may be spaced apart from each other in the respective pixel regions.

That is, since a single pixel region separately includes a single PIN diode connected to a single thin film transistor, several neighboring PIN diodes may be spaced apart from one another without being connected to each other.

In this case, when a separate PIN diode for each pixel region is formed, a PIN film is formed across the entirety of the base substrate, and the respective PIN layers spaced apart from each other are then formed through etching.

However, a PIN layer formed of multiple semiconductor layers is easily damaged by the etching process, such that it is very difficult to control etching conditions to form the PIN layer without damage.

Specifically, when an individual PIN diode is formed per pixel region, an interface of the etched side of the PIN layer is affected by visible light generated from the scintillator layer, such that a leakage current of the PIN diode greatly increases.

BRIEF SUMMARY

Therefore, the present disclosure has been made in view of the above problems, and embodiments of the present disclosure provide an array substrate for an X-ray detector to facilitate formation of a PIN diode without controlling an etching condition of a PIN diode, and an X-ray detector including the same.

Another embodiment of the present disclosure provides an array substrate for an X-ray detector to reduce or minimize an increase in a leakage current generated from an interface of the side of the PIN diode, and the X-ray detector including the same.

Embodiments of the present disclosure are not limited to the above-described embodiments and other embodiments and advantages can be appreciated by those skilled in the art from the following description. Further, it will be easily appreciated that the objects and advantages of the present disclosure can be practiced by means recited in the appended claims and a combination thereof.

Various embodiments of the present disclosure are directed to providing an array substrate for an X-ray detector and the X-ray detector including the same that substantially obviate one or more problems due to limitations and disadvantages of the related art.

In accordance with an aspect of the present disclosure, an array substrate for a digital X-ray detector includes a base substrate in which a plurality of gate lines and a plurality of data lines arranged perpendicular to the plurality of gate lines are disposed, configured to include a plurality of pixel regions defined by overlapping portions or intersection points of the gate lines and the data lines, a plurality of thin film transistors are disposed close to or proximate the overlapping portions or intersection points of the gate lines and the data lines, a plurality of lower electrodes disposed in the respective pixel regions, and connected to the respective thin film transistors, a PIN layer formed over the plurality of lower electrodes, and configured to cover the entirety of the plurality of pixel regions, a plurality of upper electrodes corresponding to respective plurality of lower electrodes disposed over the PIN layer, and a light shielding portion disposed between the upper electrodes neighboring each other.

The PIN layer is configured as a single integrated PIN layer covering the entire pixel region, such that a PIN layer for each pixel region need not be formed. Therefore, the etching process for forming each PIN layer per pixel region need not be used, such that a leakage current capable of being generated from an interface of the side of the PIN layer is reduce or minimized.

The plurality of upper electrodes may not be formed in a non-pixel region other than the pixel region, such that contiguous upper electrodes may be spaced apart from each other. If the upper electrodes are implemented as a single electrode covering the entirety of the pixel regions in the same manner as in the PIN layer, an electric field caused by the upper electrodes unavoidably occurs even in the PIN layer of the non-pixel region. However, the upper electrodes of the embodiments are disposed to be spaced apart from each other, such that a minimum electric field occurs in the non-pixel region.

The light shielding portion is disposed to cover the thin film transistor. In more detail, the light shielding portion may be disposed over the PIN layer of the non-pixel region, or may be disposed over the protective layer covering the entire PIN layer. In this way, the light shielding portion is disposed in the non-pixel region, prevents light from arriving at the non-pixel region, and suppresses light reaction of the PIN diode, resulting in reduction of a leakage current.

The light shielding portion may be disposed along the gate line and the data line, such that the light shielding portion can effectively suppress light reaction of the PIN diode within the non-pixel region without reducing the number of pixel regions.

The PIN layer may include a negative (N-type) semiconductor layer, an intrinsic (I-type) semiconductor layer, and a positive (P-type) semiconductor layer. At least one of the N-type semiconductor layer and the P-type semiconductor layer corresponding to a non-pixel region other than the pixel regions may be removed. The non-pixel region may include the gate line and the data line. Therefore, in order to prevent light arrival by means of the light shielding portion as well as to reduce or minimize light reaction in the non-pixel region, some parts of the PIN layer are removed to block light reaction in the corresponding region, such that a leakage current can be more efficiently reduced or minimized.

DETAILED DESCRIPTION

Figure 1:
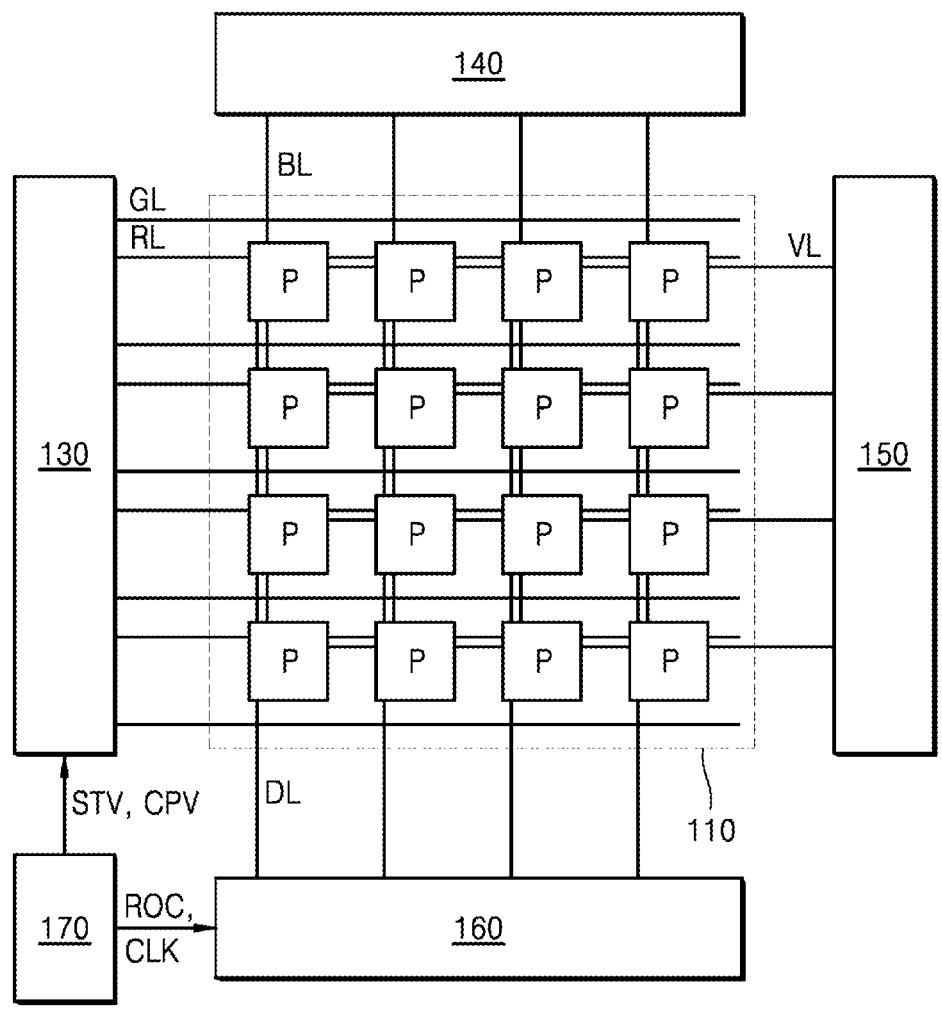
FIG. 1 is a schematic block diagram illustrating a digital X-ray detector according to an embodiment of the present disclosure.

The features and advantages of the above embodiments will become apparent from the detailed description with reference to the accompanying drawings. Embodiments are described in sufficient detail to enable those skilled in the art in the art to easily practice the technical idea of the present disclosure. Detailed descriptions of well known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

The embodiments of the present disclosure will hereinafter be described with reference to the attached drawings.

In the following description, assuming that a certain object is formed above (over) or below (beneath) the respective constituent elements, this means that two constituent elements are brought into direct contact with each other, or one or more constituent elements are disposed and formed between two constituent elements. In addition, assuming that a certain object is formed over or below the respective constituent elements, this means that the object may also be arranged in upward or downward directions on the basis of the position of one constituent element.

It will be understood that when one element is referred to as being "connected to", "coupled to", or "accessed by" another element, one element may be "connected to", "coupled to", or "accessed by" another element via a further element although one element may be directly connected to or directly accessed by another element.

FIG. 1 is a schematic plan view illustrating a digital X-ray detector. Referring to FIG. 1, the digital X-ray detector may include a thin film transistor (TFT) array 110, a gate driver 130, a bias supply 140, a power supply 150, a readout circuit 160, and a timing controller 170.

The TFT array 110 may sense X-rays emitted from an energy source, may perform photoelectric conversion of the sensed signal, and may thus output an electrical detection signal. In the TFT array 110, each cell region may be defined not only by a plurality of gate lines (GL) arranged in a horizontal direction, but also by a plurality of data lines (DL) arranged in a vertical direction perpendicular to the horizontal direction. Each cell region of the TFT array 110 may include a plurality of photosensitive pixels (P) arranged in a matrix.

Each photosensitive pixel (P) may include a PIN diode configured to sense light converted from X-rays and output the sensed light as a signal, and a thin film transistor (TFT) configured to transmit a detection signal output from the PIN diode in response to a gate signal. One side of the PIN diode may be connected to the thin film transistor (TFT), and the other side thereof may be connected to a bias line (BL).

A gate electrode of the thin film transistor (TFT) may be connected to the gate line (GL) through which a scan signal is transmitted, a source electrode may be connected to the PIN diode, and a drain electrode may be connected to the data line (DL) through which the detection signal is transmitted. The bias line BL may be arranged parallel to the data line (DL).

The gate driver 130 may sequentially apply a plurality of gate signals, each of which has a gate-ON voltage level, through the gate lines (GL). The gate driver 130 may also apply a plurality of reset signals, each of which has a gate-ON voltage level, through a plurality of reset lines (RL). Here, the gate-ON voltage level may refer to a voltage level at which thin film transistors of the photosensitive pixels can be turned on. The thin film transistors of the photosensitive pixels may be turned on in response to a gate signal or a reset signal.

The gate driver 130 may be an integrated circuit (IC) such that the gate driver 130 may be populated on an external substrate connected to the TFT array 110 or may be formed over the TFT array 110 through a Gate In Panel (GIP) process.

The bias supply 140 may apply a drive voltage through bias lines (BL). The bias supply 140 may apply a predetermined voltage to the PIN diode. In this case, the bias supply 140 may selectively apply a reverse bias or a forward bias to the PIN diode.

The power supply 150 may supply a power-supply voltage to the photosensitive pixels through power-supply voltage lines (VL).

The readout circuit 160 may read out the detection signal generated from the thin film transistor (TFT) that is turned on in response to the gate signal. Accordingly, the detection signal generated from the PIN diode may be input to the readout circuit 160 through the data lines (DL).

The readout circuit 160 may include a signal detector, a multiplexer, etc. The signal detector may include a plurality of amplification circuits corresponding to the data lines (DL) on a one to one basis, and each amplification circuit may include an amplifier, a capacitor, a reset element, etc.

In order to control the gate driver 130, the timing controller 170 may generate a start signal (STV), a clock signal (CPV), etc., and may transmit the start signal (STV), the clock signal (CPV), etc., to the gate driver 130. In order to control the readout circuit 160, the timing controller 170 may generate a readout control signal (ROC), a readout clock signal (CLK), etc., and may transmit the readout control signal (ROC), the readout clock signal (CLK), etc., to the readout circuit 160.

Figure 2:
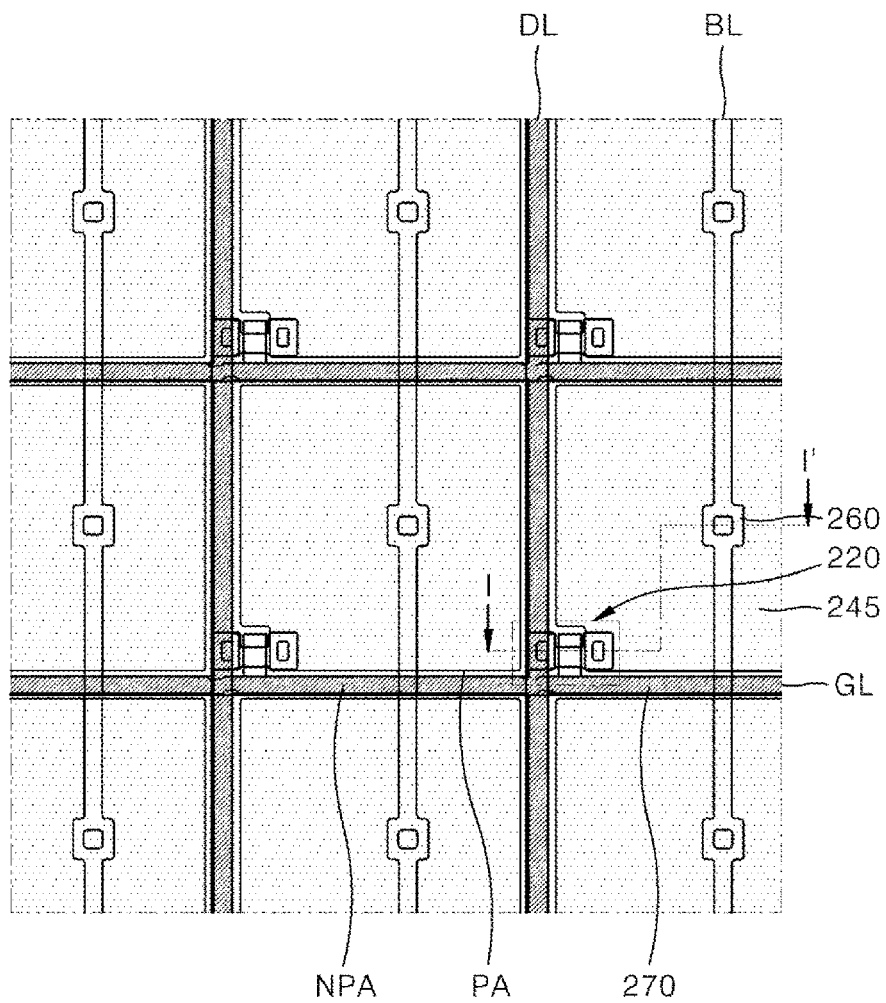
FIG. 2 is a plan view illustrating an array substrate for a digital X-ray detector corresponding to a plurality of pixel regions according to an embodiment of the present disclosure.
Figure 3:
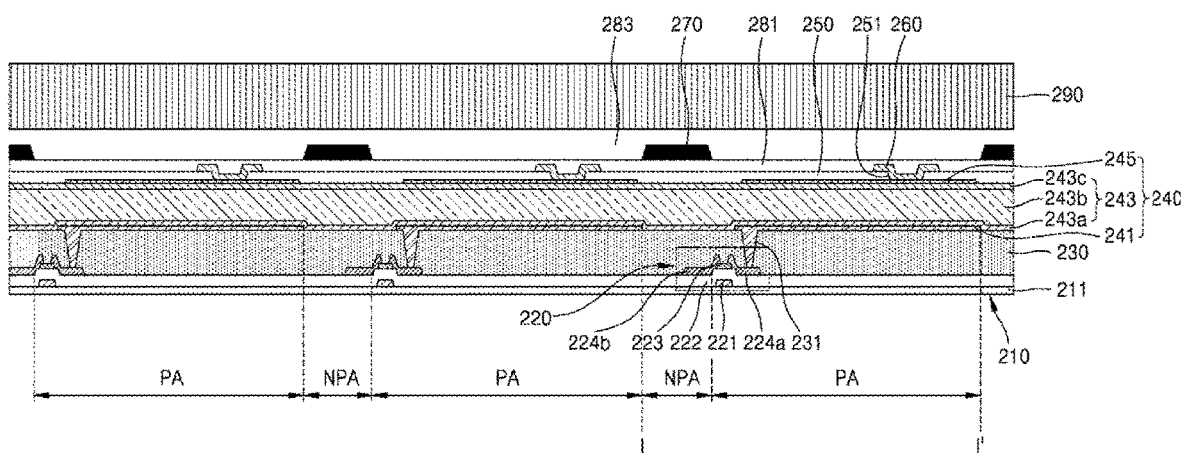
FIG. 3 is a cross-sectional view illustrating an array substrate for a digital X-ray detector corresponding to a plurality of pixel regions according to an embodiment of the present disclosure.

An array substrate 210 for a digital X-ray detector corresponding to a plurality of pixel regions (PA) and the digital X-ray detector 200 including the same according to an embodiment of the present disclosure will hereinafter be described with reference to FIGS. 2 and 3.

A plurality of gate lines GL and a plurality of data lines DL perpendicular to the plurality of gate lines GL may be disposed over a base substrate 211. Pixel regions (PA) may be defined by overlapping portions or intersection regions of the gate lines GL arranged in one direction and the data lines DL arranged in the other direction perpendicular to the gate lines GL.

Intersection regions of the gate lines GL arranged in one direction and the data lines DL arranged in the other direction perpendicular to the gate lines GL may include a plurality of pixel regions (PA) arranged in a matrix. In this case, the remaining regions other than the pixel regions (PA) may be defined as non-pixel regions (NPA), the non-pixel regions (NPA) may refer to a boundary portion of the pixel regions (PA), and may also refer to the regions, each of which includes a gate line GL and data line DL. In the following description, the arrangement and relationship of devices (or elements) included in a single pixel region (PA) will hereinafter be described, and may also be equally applied to other pixel regions (PA) unless otherwise specifically stated.

A separate thin film transistor 220 may be formed for each pixel region (PA) so as to correspond to the single pixel region (PA). Therefore, a plurality of thin film transistors 220 may be disposed over the base substrate 211 defined by the plurality of pixel regions PA. In this case, although a buffer layer (not shown), that is formed of a monolayer or multilayer structure formed of a silicon oxide (SiOx) film or silicon nitride (SiNx) film, may be disposed between the base substrate 211 and the thin film transistor 220, the buffer layer (not shown) may also be omitted according to materials formed over the base substrate 211 as necessary.

In more detail, the thin film transistor 220 may be formed to include a gate electrode 221, an active layer 223, a source electrode 224a, and a drain electrode 224b.

In order to prevent reduction of the fill factor of a PIN diode 240, the thin film transistor 220 connected to the gate line GL and the data line DL may be disposed close to an intersection point of the gate line GL and the data line DL.

The fill factor refers to the ratio of the light reception region of the X-ray detector to one pixel region. In more detail, the fill factor is defined by the ratio of the region of the PIN diode 240 to one pixel region. Therefore, if the fill factor is reduced, although visible light corresponding to the reduced fill factor is emitted to the PIN diode 240, the number of converted electric signals is also reduced by reduction of the light reception region, such that performance or throughput of the X-ray detector is also deteriorated.

Therefore, the respective thin film transistors 220 to be connected to the PIN diode 240 in a plurality of pixel regions (PA) may be disposed close to intersection points of the gate lines GL and the data lines DL.

In more detail, each of the thin film transistors 220 may be disposed in the pixel region (PA), or only some parts of the thin film transistors 220 may be disposed in the pixel region (PA). In addition, the thin film transistors 220 may be disposed along a gate line or a data line disposed in the non-pixel region (NPA) other than the pixel region (PA), such that reduction in fill factor of the PIN diode 240 may be reduced or minimized.

A plurality of gate electrodes 221 formed of conductive materials may be respectively disposed over the base substrate 211 corresponding to the plurality of pixel regions (PA). Each of the gate electrodes 221 may be formed of any one material selected from a group composed of molybdenum (Mo), aluminum (Al), chrome (Cr), gold (Au), titanium (Ti), nickel (Ni), and copper (Cu), or may be formed of alloys thereof. The gate electrode 223 may be formed of a monolayer or multilayer structure.

A gate insulation layer 222 covering the entire surface of the base substrate 211 may be disposed over the gate electrodes 221. The gate insulation layer 222 may be a monolayer or multilayer structure formed of a silicon oxide (SiOx) film or a silicon nitride (SiNx) film.

An active layer 223 may be disposed over the gate insulation layer 222 corresponding to each of the gate electrodes 221. In both ends of the active layer 223, the source and drain electrodes 224a, 224b may contact the active layer and the source electrode may be electrically connected through the active layer to the drain electrode 224b. In this case, the active layer 223 may be formed of an oxide semiconductor material such as indium gallium zinc oxide (IGZO), or may also be formed of a Low Temperature Polycrystalline Silicon (LTPS) material or an amorphous silicon (a-Si).

A first protective layer 230 covering the entire surface of the base substrate 211 may be disposed over the source electrode 224a and the drain electrode 224b. In the first protective layer 230 corresponding to each pixel region PA, a first contact hole 231 may be formed to correspond to the source electrode 224a. A lower electrode 241 of the PIN diode 240 may be disposed over the first protective layer 230 through the first contact hole 231 allocated for each pixel region PA, such that the lower electrode 241 may be connected to the source electrode 224a of the thin film transistor 220.

The PIN diode 240 may be disposed over the pixel region PA. The lower electrode 241 of the PIN diode 240 being connected to the thin film transistor 220 through the first contact hole 231 may be formed over the first protective layer 230. In this case, the lower electrode 241 may be disposed to correspond to each pixel region (PA), and the lower electrodes 241 of adjacent or neighboring pixel regions (PA) may be spaced apart from one another without being interconnected. The lower electrode 241 may be formed of a non-transparent metal such as molybdenum (Mo) or a transparent oxide material such as indium tin oxide (ITO), indium zinc oxide (IZO), or zinc oxide (ZnO) according to characteristics of the PIN diode 240.

An integrated PIN layer 243 covering the entire surface of the pixel regions (PA) may be disposed over the lower electrode 241 of the PIN diode 240 corresponding to a plurality of pixel regions PA.

In more detail, the PIN layer 243 in which an N-type (negative) semiconductor layer having N-type impurities, an intrinsic (I-type) semiconductor layer having no impurities, and a P-type (positive) semiconductor layer including P-type impurities are sequentially stacked, may be formed.

The intrinsic (I-type) semiconductor layer 243b may be formed to have a larger thickness as compared to the N-type semiconductor layer 243a and the P-type semiconductor layer 243c. The PIN layer 243 may include a material capable of converting visible light converted from X-rays through the scintillator layer 290 into an electric signal. For example, the PIN layer 243 may include amorphous selenium (a-Se), mercuric iodide (HgI2), cadmium telluride (CdTe), lead oxide (PbO), lead iodide (PbI2), bismuth triiodide (BiI3), gallium arsenide (GaAs), germanium (Ge), and the like.

As described above, the PIN layer 243 according to the present disclosure is formed of a single integrated PIN layer 243 covering the entire surface of the pixel regions (PA), such that each PIN layer 243 need not be formed per pixel region (PA). Therefore, the etching process for forming each PIN layer 243 per pixel region (PA) need not be used, such that the PIN layer 243 is prevented from being damaged by etching.

In addition, the integrated PIN layer 243 is implemented to cover all pixel regions (PA), such that an interface of the side of the PIN layer 243 in each pixel region (PA) is not exposed outside, and light reaction caused by the interface at the side surface of the PIN diode 243 is suppressed, resulting in minimum leakage current.

A plurality of upper electrodes 245 corresponding to the respective lower electrodes 241 may be disposed over the PIN layer 243. The plurality of upper electrodes 245 may not be formed in the non-pixel regions (NPA) and may be disposed in a manner that the adjacent or neighboring upper electrodes 245 are spaced apart from each other. For example, the upper electrodes 245 may be disposed to correspond to the respective pixel regions (PA) other than the overlapping portions or regions formed at the overlap of the gate lines GL and the data lines DL.

An upper electrode 245 may be formed of a transparent conductive material such as indium tin oxide (ITO), indium zinc oxide (IZO), or zinc oxide (ZnO) so as to increase light transmission efficiency of the scintillator layer 290 that receives X-rays and performs conversion of a wavelength of the X-rays.

If the upper electrodes 245 are implemented as a single integrated electrode to cover the entire surface of the pixel regions (PA) in the same manner as in the PIN layer 243, an electric field caused by the upper electrodes 245 may also be formed in the PIN layer 243 of the non-pixel region (NPA), resulting in increased leakage current.

However, since the plurality of upper electrodes 245 may be respectively formed in the pixel regions (PA), each non-pixel region (NPA) does not include each upper electrode 245, such that a minimum electric field occurs in the non-pixel regions (NPA) and generation of the leakage current can be minimized.

Figure 5:
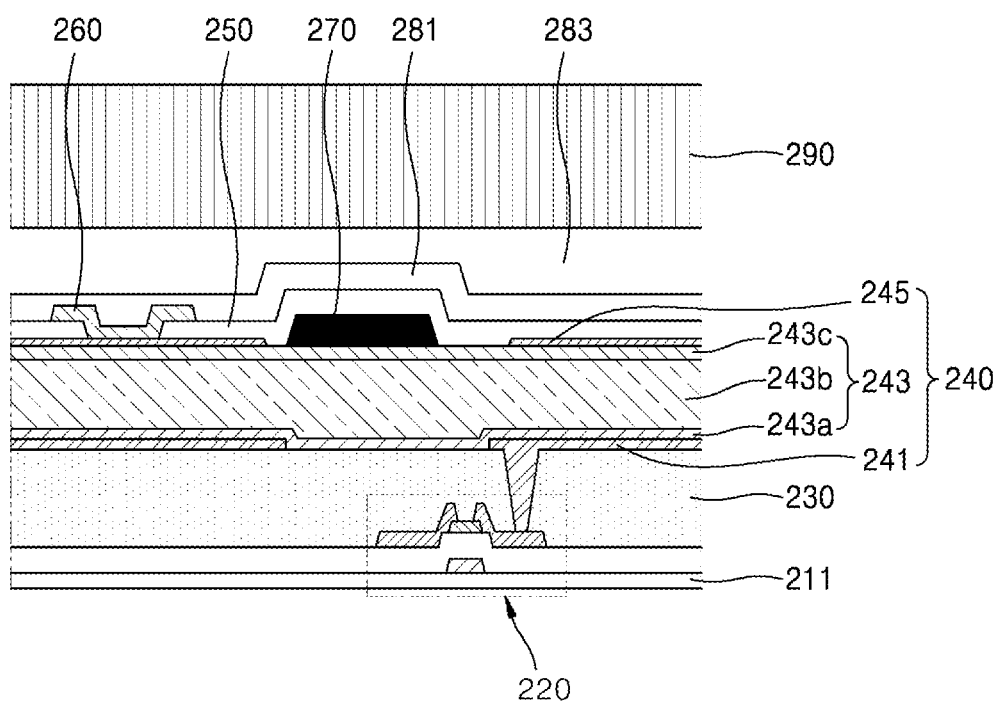

A light shielding portion 270 may be disposed between neighboring upper electrodes 245. In this case, the light shielding portion 270 may be disposed over the PIN layer 243 as shown in FIG. 5. The light shielding portion 270 may shield and absorb incident light, may be formed of a non-transparent metal material or an organic material through which light does not penetrate. For example, the light shielding portion 270 may use a black matrix.

In more detail, the light shielding portion 270 may be disposed in a non-pixel region (NPA) other than the pixel region (PA). In accordance with the present disclosure, the PIN layer 243 is formed to cover the pixel region (PA) and the entire surface of the non-pixel region (NPA), light reaction caused by visible light generated from the scintillator layer 290 may also occur in the non-pixel region (NPA) other than the pixel region (PA). In this way, when light reaction caused by visible light occurs in the PIN layer 243 of the non-pixel region (NPA), a leakage current may increase.

Therefore, the light shielding portion 270 is disposed in the non-pixel region (NPA), the amount of visible light arriving at the non-pixel region (NPA) can be reduced or minimized, such that light reaction of the PIN layer 243 is prevented from occurring in the non-pixel region (NPA), resulting in reduction in leakage current.

In addition, the light shielding portion 270 may be disposed along the gate line GL and the data line DL, such that the pixel region (PA) is not reduced in size and the number of light-reactions of the PIN diode 240 in the non-pixel region (NPA) can be effectively reduced or minimized.

The light shielding portion 270 may be disposed to cover the thin film transistor, such that light may be prevented from directly arriving at the thin film transistor.

In order to more effectively suppress light reaction of visible light in the non-pixel region (NPA), at least one of the N-type semiconductor layer 243a and the P-type semiconductor layer 243c that correspond to the non-pixel region (NPA) may be removed from the PIN layer 243 including the N-type semiconductor layer 243a, the I-type semiconductor layer 243b, and the P-type semiconductor layer 243c.

Figure 6:
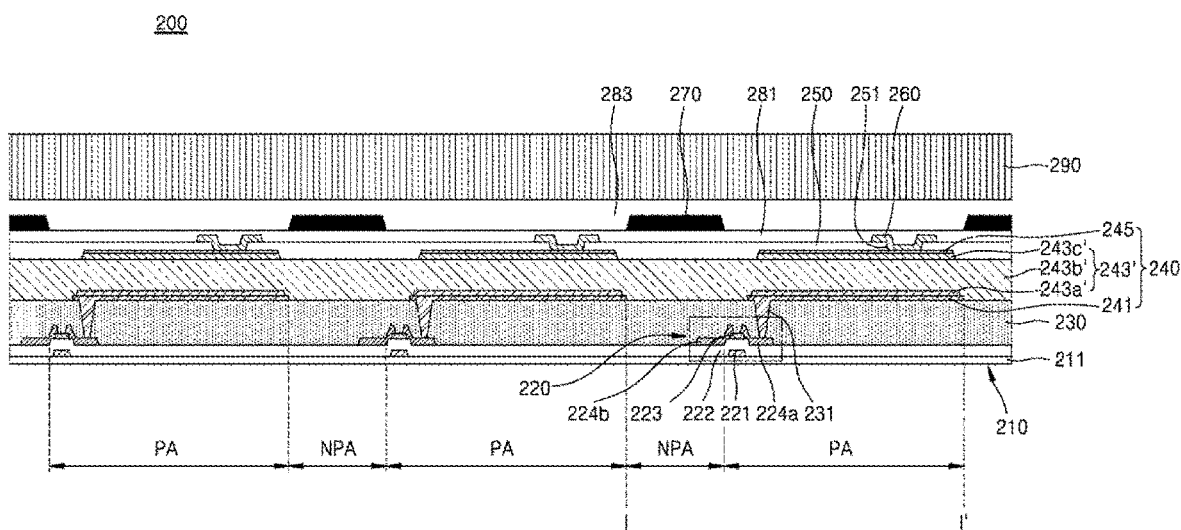
FIG. 6 illustrates an example in which some parts of a PIN layer are removed from a non-pixel region for use in an array substrate for a digital X-ray detector according to an embodiment.

Referring to FIG. 6, in the pixel region (PA), the PIN layer 243' formed across the plurality of pixel regions (PA) is implemented as a perfect PIN layer 243' that includes an N-type semiconductor layer 243a', an I-type semiconductor layer 243b', and a P-type semiconductor layer 243c'. In contrast, in the non-pixel region (NPA), the N-type semiconductor layer 243a' and the P-type semiconductor layer 243c' are removed from the PIN layer 243', and the PIN layer 243c' has only the I-type semiconductor layer 243b', such that the PIN layer 243' is implemented as an imperfect PIN layer in the non-pixel region (NPA).

As described above, the PIN layer corresponding to the non-pixel region (NPA) is implemented as an imperfect PIN layer from which some parts of the N-type semiconductor layer 243a' and the P-type semiconductor layer 243c' are removed. As a result, although visible light not shielded by the light shielding portion 270 arrives at the PIN layer of the non-pixel region (NPA), little electrical conversion of the visible light may occur.

As described above, electrical conversion of visible light in the non-pixel region (NPA) is reduced or minimized, such that a leakage current generated in the non-pixel region (NPA) can be more effectively reduced or minimized.

A second protective layer 250 formed to cover the upper electrode 245 and the entire surface of the PIN layer 243 may be disposed over the plurality of upper electrodes 245. In this case, the second protective layer 250 corresponding to the respective upper electrodes 245 may be provided with a second contact hole 251. A bias electrode 260 may be formed over the second protective layer 250 of each pixel region (PA), such that the bias electrode 260 may be connected to the upper electrode 245 of the PIN diode 240 through the second contact hole 251.

Figure 4:
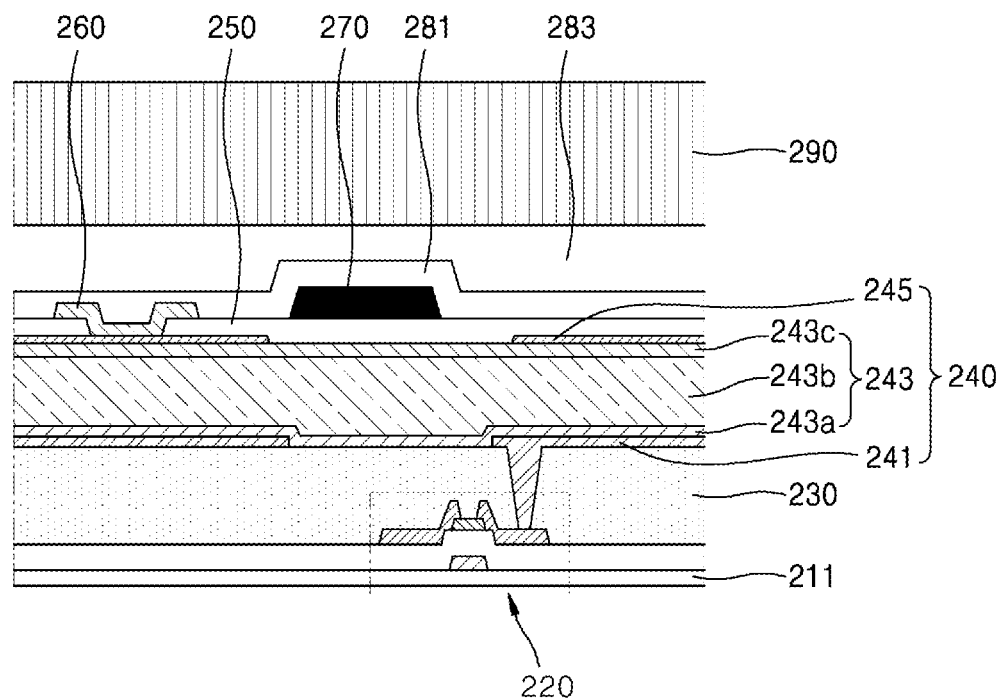
FIGS. 4 and 5 illustrate different examples based on the arrangement position of a light shielding portion for use in an array substrate for a digital X-ray detector according to different embodiments of the present disclosure.

A third protective layer 281 covering the entire surface of the second protective layer 250 may be disposed over the plurality of bias electrodes 260. In this case, the light shielding portion 270 may be disposed over the third protective layer 281 or the second protective layer 250 of the non-pixel region (NPA) as shown in FIGS. 3 and 4. As described above, the light shielding portion 270 may be disposed over any one layer selected from among the PIN layer 243, the second protective layer 250, and the third protective layer 281, and may be disposed to increase fabrication efficiency.

A planarization layer 283 formed of an organic material may be disposed over the third protective layer 281, and the scintillator layer 290 may be disposed over the planarization layer 283. The scintillator layer 290 may be formed in a film shape over the planarization layer 283, or may also be formed over the third protective layer 281 or the planarization layer 283 through additional growth processing. In this case, the scintillator layer 290 may be formed of cesium iodide (CsI).

The above-mentioned digital X-ray detector 200 may operate as follows.

X-rays emitted to the digital X-ray detector 200 may be converted into visible light by the scintillator layer 290. The visible light may be converted into an electronic signal by the PIN layer 243 of the PIN diode 240.

In more detail, when visible light is emitted to the PIN layer 243, the intrinsic (I-type) semiconductor layer 243b is depleted by the P-type semiconductor layer 243c and the N-type semiconductor layer 243a, and thus generates an electric field therein. Electrons and holes generated by light may be drifted by the electric field, and are then collected in the P-type semiconductor layer 243c and in the N-type semiconductor layer 243a, respectively.

The PIN diode 240 may convert visible light into an electronic signal, and may deliver the electronic signal to the thin film transistor 220. The delivered electronic signal may be displayed as an image signal after passing through the data line connected to the thin film transistor 220.

As described above, the array substrate for the digital X-ray detector according to the present disclosure does not form the PIN layer of the PIN diode for each pixel region, and configures the PIN layer in the form of an integrated structure capable of covering all pixel regions. Therefore, the array substrate for the digital X-ray detector according to the present disclosure does not require the etching process for forming an additional PIN layer for each pixel region, increases productivity by facilitating fabrication of the PIN diode, and reduces or minimizes a leakage current by preventing damage caused by such etching.

In the integrated PIN diode corresponding to the entire pixel region indicating all pixel regions, the lower electrode and the upper electrode are not formed in an integrated structure covering the entire pixel region in a different way from the PIN layer, are spaced apart from each other in respective pixel regions, such that the number of electric fields formed in the non-pixel region not the pixel region can be reduced or minimized. Therefore, a main channel of the PIN diode is formed of a PIN layer corresponding to an upper electrode and a lower electrode of each pixel region, resulting in implementation of stable PIN diode characteristics.

In order to effectively prevent the light reaction of the PIN layer from occurring in the non-pixel region, a light shielding portion is disposed in a non-pixel region located between contiguous upper electrodes of the PIN diode so as to shield visible light from the scintillator layer, such that visible light reacting in the PIN layer of the non-pixel region can be reduced or minimized.

Since at least one of the N-type semiconductor layer and the P-type semiconductor layer of the PIN layer of the non-pixel region is removed, visible light that has arrived at the PIN layer without being shielded by the light shielding portion in the non-pixel region is prevented from light-reacting with the imperfect PIN layer, such that a leakage current of the PIN diode can be reduced or minimized.

As is apparent from the above description, the embodiments of the present disclosure need not control a fabrication condition for forming the PIN layer, and may facilitate a fabrication process of the PIN diode, resulting in an increase in overall fabrication productivity.

The embodiments of the present disclosure need not form a separate PIN layer using an etching process for each pixel region, thereby minimizing a leakage current capable of being generated from an interface of the side of the etched PIN layer.

Although the PIN layer of the PIN diode is formed as a single integrated structure to cover the entire pixel region, upper electrodes of the PIN diodes are spaced apart from one another in the respective pixel regions, and an electric field generated in a non-pixel region is reduced or minimized such that generation of a leakage current is also reduced or minimized.

In addition, the embodiments of the present disclosure may arrange a light shielding portion in a non-pixel region, or may remove some layers of the PIN layer, such that the number of light-reactions encountered in the non-pixel region is reduced or minimized, resulting in a reduced or minimum leakage current.

The present disclosure described above may be variously substituted, altered, and modified by those skilled in the art to which the present disclosure pertains without departing from the scope and sprit of the present disclosure. Therefore, the present disclosure is not limited to the above-mentioned exemplary embodiments and the accompanying drawings.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An array substrate for a digital X-ray detector, comprising:
    a base substrate including a plurality of gate lines and a plurality of data lines arranged perpendicular to the plurality of gate lines, the base substrate configured to include a plurality of pixel regions positioned proximate to overlapping locations of the plurality of gate lines and the plurality of data lines;
    a plurality of thin film transistors proximate the overlapping locations of the gate lines and the data lines;

a plurality of lower electrodes in the respective pixel regions, and the plurality of lower electrodes connected to the respective thin film transistors;

a PIN layer over the plurality of lower electrodes and configured to cover an entirety of the plurality of pixel regions;

a plurality of upper electrodes corresponding to the respective plurality of lower electrodes positioned over the PIN layer; and a light shielding portion disposed between neighboring ones of the plurality of upper electrodes.

2. The array substrate of claim 1, wherein the plurality of upper electrodes are spaced apart from each other over the PIN layer.

3. The array substrate of claim 1, wherein the light shielding portion is disposed along the plurality of gate lines and the plurality of data lines.

4. The array substrate of claim 1, wherein the light shielding layer covers the plurality of thin film transistors.

5. The array substrate of claim 1, wherein the light shielding layer is over the PIN layer.

6. The array substrate of claim 1, further comprising:
a protective layer over the upper electrodes to cover an entirety of the PIN layer;
wherein the light shielding portion is disposed over the protective layer.

7. The array substrate of claim 1, wherein:
the PIN layer includes a negative (N-type) semiconductor layer, an intrinsic (I-type) semiconductor layer, and a positive (P-type) semiconductor layer, and
wherein at least one of the N-type semiconductor layer and the P-type semiconductor layer is removed in a non-pixel region other than the plurality of pixel regions.

8. The array substrate of claim 1, wherein a non-pixel region other than the plurality of pixel regions includes the plurality of gate lines and the data lines.

9. A digital X-ray detector, comprising:
an array substrate including:
a base substrate having a plurality of gate lines and a plurality of data lines, the plurality of data lines being arranged perpendicular to the plurality of data lines to form a plurality of overlapping portions of the plurality of gate and data lines, and the plurality of overlapping portions defining a plurality of pixel regions of the base substrate;
a plurality of thin film transistors, each of the plurality of thin film transistors being proximate a corresponding one of the plurality of overlapping portions;
a plurality of lower electrodes, each of the plurality of lower electrodes being in a corresponding one of the plurality of pixel regions and coupled to the one of the plurality of thin film transistors proximate the corresponding one of the plurality of overlapping portions;
a PIN layer over the plurality of lower electrodes, the PIN layer covering all of the plurality of pixel regions;
a plurality of upper electrodes over the PIN layer, each of the plurality of upper electrodes positioned opposing a corresponding one of the plurality of lower electrodes; and a light shielding portion between neighboring ones of the plurality of upper electrodes; and
a scintillator layer disposed over the array substrate.

10. The digital X-ray detector of claim 9, wherein the plurality of upper electrodes are spaced apart from one another, each of the plurality of upper electrodes disposed in a corresponding pixel region.

11. The digital X-ray detector of claim 9, wherein the light shielding portion is disposed along the plurality of gate lines and the plurality of data lines.

12. The digital X-ray detector of claim 9, wherein the light shielding layer covers at least a portion of each of the plurality of thin film transistors.

13. The digital X-ray detector of claim 9, wherein the base substrate further comprises a non-pixel region corresponding to a region of the base substrate other than the plurality of pixel regions, and wherein plurality of gate lines and data lines are in the non-pixel region.

14. The digital X-ray detector of claim 13, wherein the PIN layer includes a plurality of layers and does not include at least one of the plurality of layers in the non-pixel region.

15. The digital X-ray detector of claim 9 further comprising at least one protective layer over the upper electrodes, and wherein the light shielding portion is on the at least one protective layer.

16. An array substrate, comprising:
a base substrate including a plurality of gate lines and a plurality of data lines arranged perpendicular to the plurality of gate lines, a plurality of pixel regions defined at intersection points of the plurality of gate lines and data lines;
a plurality of thin film transistors, each thin film transistor being in a corresponding one of the plurality of pixel regions;
a plurality of lower electrodes, each lower electrode in a corresponding one of the pixel regions and coupled to the corresponding thin film transistor in the pixel region;
a PIN layer covering entirely the plurality of pixel regions;
a plurality of upper electrodes over the PIN layer, each upper electrode opposing a corresponding lower electrode; and
a light shielding portion between adjacent upper electrodes.

17. The array substrate of claim 16, wherein the light shielding portion extends along the plurality of gate lines and data lines.

18. The array substrate of claim 16, wherein each thin film transistor is disposed close to the corresponding intersection point of the corresponding pixel region.

19. The array substrate of claim 16, wherein the PIN layer comprises a plurality of sublayers and wherein the base substrate further comprises a non-pixel region corresponding to portions of the base substrate other than the plurality of pixel regions, and wherein the PIN layer further covers the non-pixel region and does not include at least one of the plurality of layers in the portions of the PIN layer covering the non-pixel region.

20. The array substrate of claim 19, wherein plurality of gate and data lines are in the non-pixel region of the base substrate.

* * * * *